United States Patent
Nasum et al.

(10) Patent No.: US 10,978,135 B2
(45) Date of Patent: Apr. 13, 2021

(54) ARCHITECTURE FOR RESOLUTION OF DATA AND REFRESH-PATH CONFLICT FOR LOW-POWER DIGITAL ISOLATOR

(71) Applicant: TEXAS INSTRUMENTS INCORPORATED, Dallas, TX (US)

(72) Inventors: Sreeram Subramanyam Nasum, Bengaluru (IN); Niranjan Shankar, Chennai (IN); Kumar Anurag Shrivastava, Bengaluru (IN); Kashyap Barot, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/793,447

(22) Filed: Feb. 18, 2020

(65) Prior Publication Data

US 2020/0279602 A1  Sep. 3, 2020

Related U.S. Application Data

(60) Provisional application No. 62/954,778, filed on Dec. 30, 2019.

(30) Foreign Application Priority Data

Feb. 28, 2019  (IN) .............................. 201941007805

(51) Int. Cl.
*G11C 11/406* (2006.01)
*G11C 11/409* (2006.01)
(Continued)

(52) U.S. Cl.
CPC ...... *G11C 11/40615* (2013.01); *G11C 7/1009* (2013.01); *G11C 7/222* (2013.01); *G11C 11/409* (2013.01); *G11C 11/40603* (2013.01)

(58) Field of Classification Search
CPC ........ G11C 11/40615; G11C 11/40603; G11C 7/1009; G11C 7/222; G11C 11/409; H04L 25/0266; H04B 3/02; H03K 5/1252
See application file for complete search history.

(56) References Cited

U.S. PATENT DOCUMENTS 8,175,087 B2 * 5/2012 Jadus .................. G06F 13/4063
  370/366
8,324,603 B2 * 12/2012 French ..................... G02B 6/43
  250/551

(Continued)

OTHER PUBLICATIONS

International Search Report in corresponding PCT Application No. PCT/US2020/020110, dated May 28, 2020, (2 pages).

*Primary Examiner* — Tri M Hoang
(74) *Attorney, Agent, or Firm* — John R. Pessetto; Charles A. Brill; Frank D. Cimino

(57) ABSTRACT

An encoding and transmitting system for a digital isolator system includes a transmitter for transmitting combined edge indicator signals through an isolation barrier, an encoder for generating the combined edge indicator signals based on first and second signals, a refresh clock generator for generating a refresh clock signal based on the first signal, and a refresh edge generator for masking at least a portion of the refresh clock signal, such that the portion of the refresh clock signal is not reflected in the second signal. The isolation barrier of the digital isolator system may be a capacitive isolation barrier for galvanically isolating a receiver from the transmitter. If desired, the refresh edge generator may include a refresh mask generator, one or more logic gates, and a glitch filter. A method of operating a digital isolator system is also described.

20 Claims, 3 Drawing Sheets

(51) Int. Cl.
*G11C 7/10* (2006.01)
*G11C 7/22* (2006.01)

(56) References Cited

U.S. PATENT DOCUMENTS

| | | |
|---|---|---|
| 9,639,488 B2* | 5/2017 | Sadowski ................. G06F 1/04 |
| 9,941,999 B1* | 4/2018 | Milesi ................... H04L 1/0036 |
| 2008/0136442 A1 | 6/2008 | Chen |
| 2012/0183024 A1 | 7/2012 | Strzalkowski |
| 2012/0215952 A1* | 8/2012 | Werner .................. G09G 5/006 |
| | | 710/33 |
| 2018/0262297 A1 | 9/2018 | Milesi et al. |

* cited by examiner

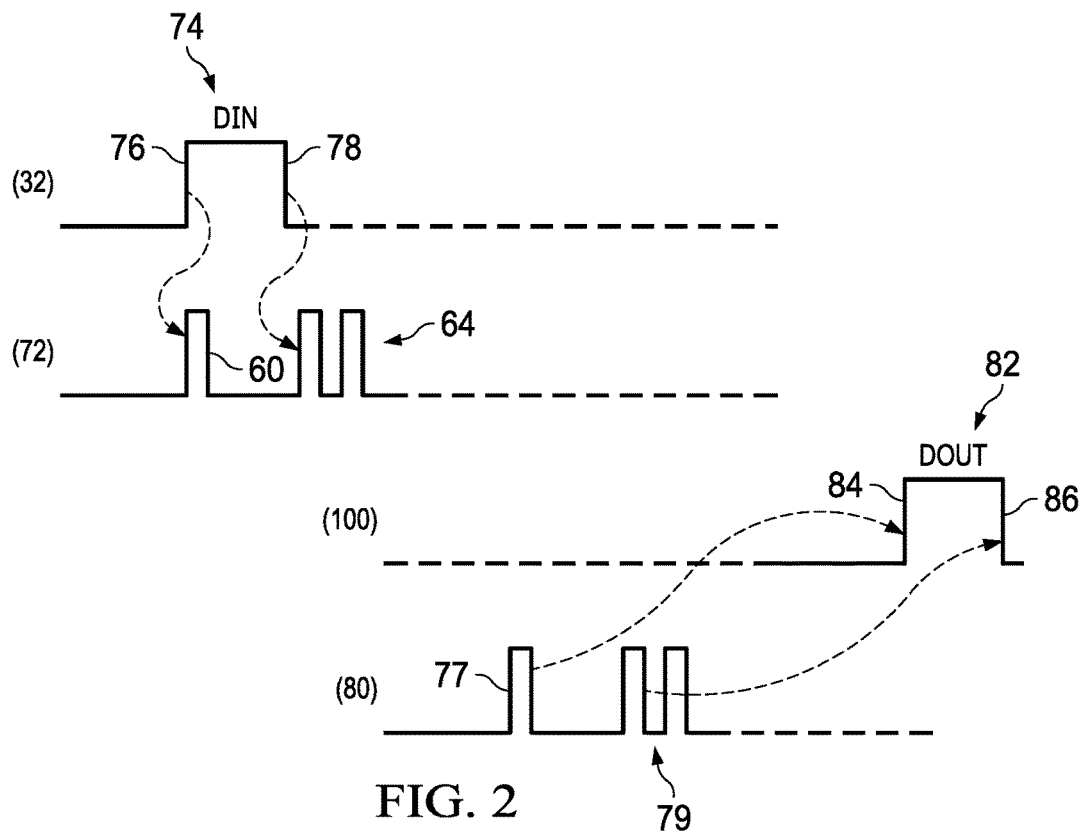
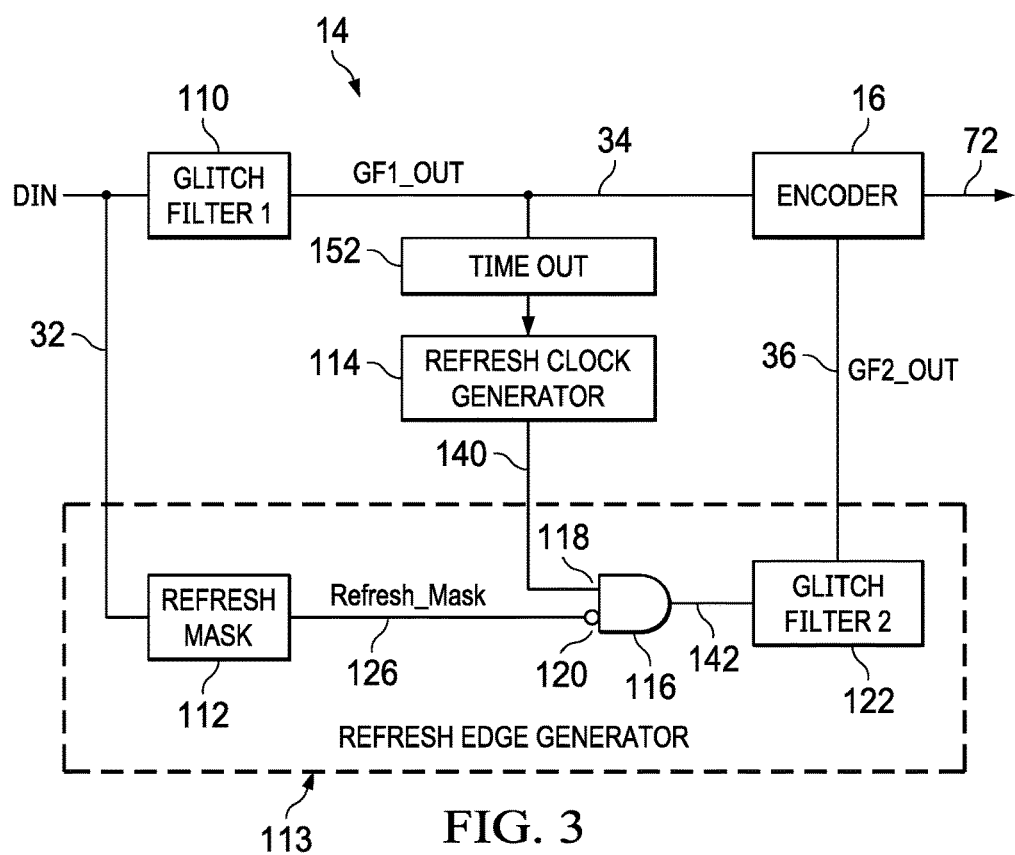
FIG. 2
FIG. 3

ARCHITECTURE FOR RESOLUTION OF DATA AND REFRESH-PATH CONFLICT FOR LOW-POWER DIGITAL ISOLATOR

This application claims priority to India Patent Application No. 201941007805, filed Feb. 28, 2019, and U.S. Provisional Patent Application No. 62/954,778, filed Dec. 30, 2019. The entire disclosures of India Patent Application No. 201941007805 and U.S. Provisional Patent Application No. 62/954,778 are hereby fully incorporated herein by reference.

BACKGROUND

It is sometimes desirable to provide galvanic isolation between first and second electrical systems. An isolation barrier can be used to prevent a direct current (DC) signal from being transmitted from the first system to the second system while permitting information encoded in, or associated with, an alternating current (AC) signal to be communicated from the first system to the second system. By encoding information in the AC signal, data in the first system can be reconstructed for use in the second system. A capacitive isolation barrier, which employs one or more capacitors, is especially useful where a high rate of data transfer and low power consumption are desirable.

SUMMARY

The present disclosure overcomes the disadvantages of the prior art to a substantial extent. The present disclosure relates to an encoding and transmitting system for a digital isolator system. The encoding and transmitting system includes: a transmitter for transmitting combined edge indicator signals through an isolation barrier; an encoder, coupled to the transmitter, for generating the combined edge indicator signals based on first and second signals; a refresh clock generator for generating a refresh clock signal based on the first signal; and a refresh edge generator, coupled to the refresh clock generator, for masking at least a portion of the refresh clock signal, such that the portion of the refresh clock signal is not reflected in the second signal.

The present disclosure also relates to a digital isolator system which has a transmitter, a receiver, and an isolation barrier for galvanically isolating the receiver from the transmitter. If desired, the digital isolator system may have a first glitch filter for generating a first glitch filter signal based on a digital data input signal, an encoder for generating combined edge indicator signals based on the first glitch filter signal and a second glitch filter signal, a refresh clock generator for generating a refresh clock signal based on the first glitch filter signal, and a refresh edge generator for masking at least a portion of the refresh clock signal, based on the digital data input signal, such that the portion of the refresh clock signal is not reflected in the second signal.

The present disclosure also relates to a method of operating a digital isolator system. According to one aspect of the present disclosure, the method may include transmitting combined edge indicator signals through an isolation barrier, generating the combined edge indicator signals based on first and second signals, generating a refresh clock signal based on the first signal, and masking at least a portion of the refresh clock signal, such that the portion of the refresh clock signal is not reflected in the second signal.

BRIEF DESCRIPTION OF THE DRAWINGS

FIG. 2 is a timing diagram for encoding and decoding processes performed by the digital isolator system of FIG. 1;

FIG. 3 is a circuit diagram of a refresh circuit and the encoder of the digital isolator system of FIG. 1;

DETAILED DESCRIPTION

Figure 1:
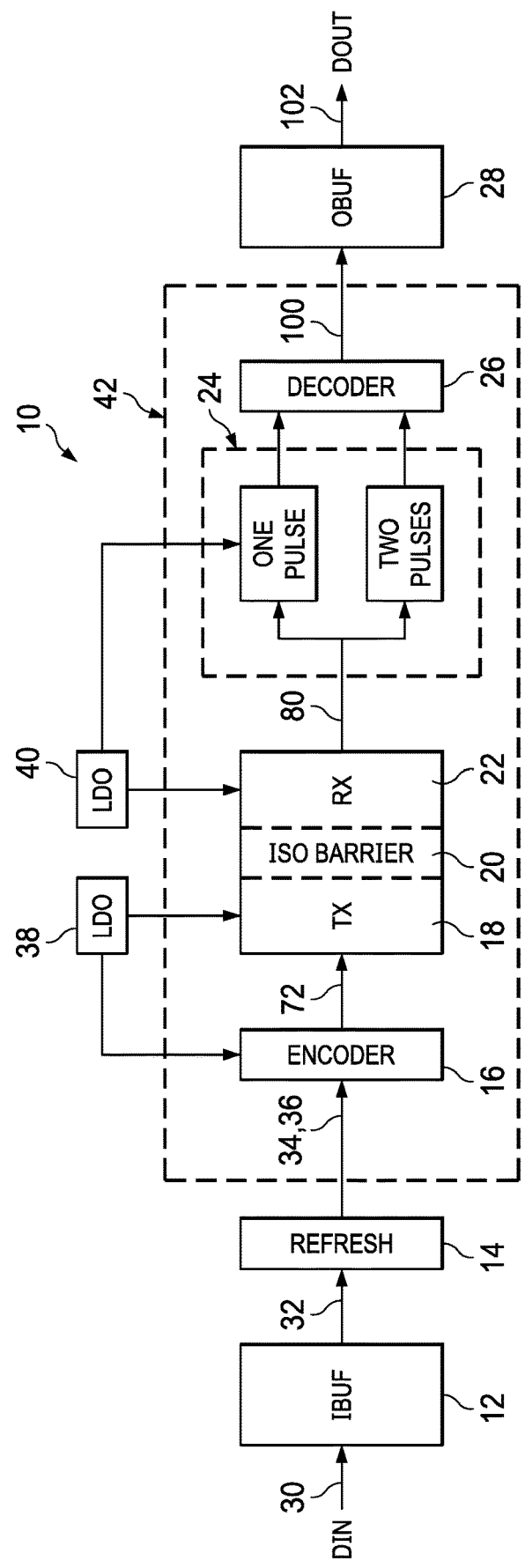
FIG. 1 is a block diagram of a digital isolator system.

Referring now to the drawings, where like elements are designated by like reference numerals (and other characters), there is shown in FIG. 1, by way of example, a digital isolator system 10 which includes an input buffer 12, a refresh circuit 14, an encoder 16, a transmitter (TX) 18, an isolation barrier 20, a receiver (RX) 22, a discriminating circuit 24, a decoder 26, and an output buffer 28. The input buffer 12 receives a digital data input signal DIN on conductive line 30, and transmits the digital data input signal DIN to the refresh circuit 14 on conductive line 32, at a suitable timing. The refresh circuit 14 transmits first and second glitch filter signals GF1_OUT, GF2_OUT to the encoder 16 on conductive lines 34, 36. The glitch filter signals GF1_OUT, GF2_OUT are discussed in more detail below.

A suitable, low potential for the encoder 16 and the transmitter 18 is supplied through a first low dropout circuit 38. A suitable, low potential for the receiver 22 and the discriminating circuit 24 is supplied through a second low dropout circuit 40.

The transmitter 18 and the receiver 22 are galvanically isolated from each other by the isolation barrier 20, which may include, for example, a silicon dioxide ($SiO_2$)-based capacitive isolation barrier. In the illustrated example, the isolation barrier 20 forms a single physical channel for communication of information from the transmitter 18 to the receiver 22. This disclosure should not be limited, however, to the examples shown and described herein. If desired, an inductor-based isolation barrier, a photo-coupler isolation barrier, or some other suitable galvanic isolation barrier may be used instead of, or together with, the capacitive isolation barrier.

If desired, at least the transmitter 18, the isolation barrier 20, and the receiver 22 may be located on or within a single integrated-circuit (IC) chip 42. Other elements of the digital isolator system 10 may also be located on or within the chip 42, if desired, as schematically illustrated in FIG. 1.

Referring now to FIG. 2, by way of example, the digital data input signal DIN may have a waveform 74 which contains leading and falling edges 76, 78. In operation, suitable edge detectors within the encoder 16 generate respective leading and falling edge indicator signals 60, 64, on line 72, with timings corresponding to those of the leading and falling edges 76, 78 of the digital data input signal DIN. The receiver 22 (FIG. 1) generates corresponding leading and falling edge indicator signals 77, 79 (on line 80), which are discriminated and decoded by the discriminator circuit 24 and the decoder 26 to generate a digital data output signal DOUT with a reconstructed waveform 82 (with leading and falling edges 84, 86).

The digital data output signal DOUT is applied to the output buffer 28 (FIG. 1) on a conductive line 100, and output by the buffer 28 on a conductive line 102, at a suitable timing. The digital data output signal DOUT may have essentially the same form, and corresponding timings of leading and falling edges, as those of the digital data input signal DIN, even though the incoming data line 32 and the outgoing data line 100 are galvanically isolated from each other by the isolation barrier 20.

Referring now to FIG. 3, the refresh circuit 14 may have a first glitch filter 110, a refresh mask generator 112, a refresh clock generator 114, an AND gate 116 (an example of a suitable logic gate) with a non-inverted input 118 and an inverted input 120 (connected through a NOT gate), and a second glitch filter 122. A refresh edge generator 113 includes the refresh mask generator 112, the AND gate 116, and the second glitch filter 122.

In operation, the first glitch filter 110 receives the digital data input signal DIN from the input buffer 12 and generates the corresponding first glitch filter signal GF1_OUT on conductive line 34. The first glitch filter signal GF1_OUT (on line 34) becomes high only when the digital data input signal DIN (received by the glitch filter 110) is high for at least for a specified amount of time. The first glitch filter signal GF1_OUT becomes low only when the digital data input signal DIN is low for at least for a specified amount of time. Otherwise, the first glitch filter signal GF1_OUT maintains its current value. In operation, the first glitch filter 110 may be used to remove noise interference from line 32, and ensure that the receiver 22 does not receive information for any two edges faster than the receiver bandwidth.

Figure 4:
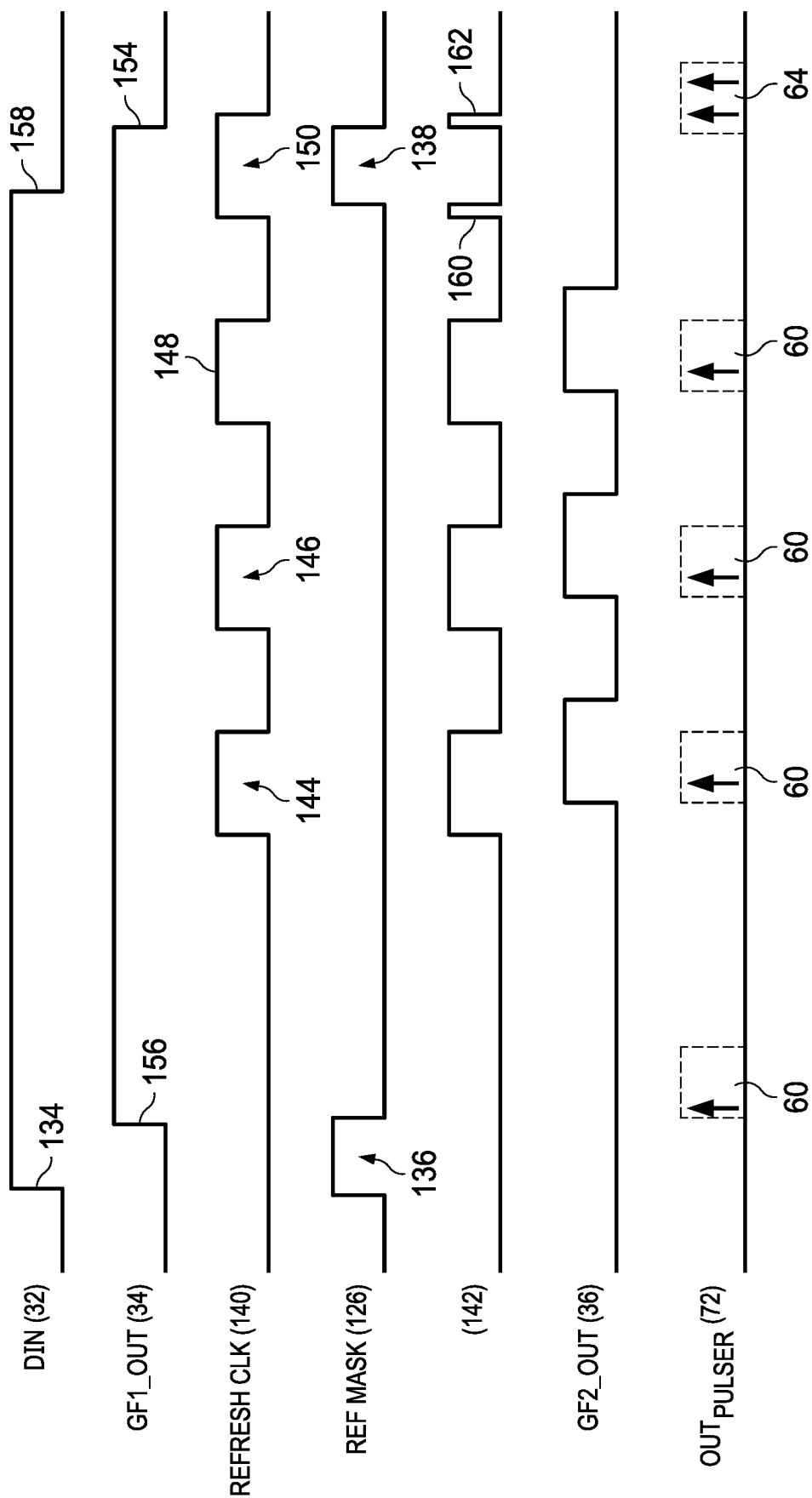
FIG. 4 is a timing diagram for a refresh process performed by the refresh circuit of FIG. 3, and the encoding process.

Referring now to FIGS. 3 and 4, the refresh clock generator 114 receives the first glitch filter signal GF1_OUT on line 34. The refresh clock generator 114 may issue a refresh clock signal (in the illustrated example, four successive, equally spaced-apart pulses (or, bursts) 144, 146, 148, 150) whenever the output of the first glitch filter 110 has not changed in a predetermined amount of time, as determined by a time-out circuit 152. As illustrated in FIG. 4, the predetermined amount of time is the time from the leading edge 156 of the first glitch filter signal GF1_OUT to the leading edge of a first pulse 144 of the refresh clock signal 144, 146, 148, 150.

One of the purposes of the refresh clock generator 114 is to remove static errors in the presence of external noise. In the illustrated example, to correct for such errors, the refresh clock generator 114 generates clock pulses 144, 146, 148, 150 until the first glitch filter signal GF1_OUT does not have a rising or a falling edge. In the illustrated example, the refresh clock generator 114 sends four periodic refresh carrier bursts 144, 146, 148, 150 into the channel to be communicated across the isolation barrier 20 for processing on the receiver side of the digital isolator system 10. However, the refresh clock signal (on line 140) may have other forms and patterns besides those shown in FIG. 4. The present disclosure should not be limited to the examples shown and described herein.

Falling and leading edges of the first glitch filter signal GF1_OUT (except for the leading edge 156 that starts the timing which results in the issuance of the refresh clock signal 144, 146, 148, 150), on the one hand, and the edges of the refresh clock signal 144, 146, 148, 150, on the other hand, are asynchronous. For example, as illustrated in FIG. 4, the timing of a falling edge 154 of the first glitch filter signal GF1_OUT is independent of those of the edges of the refresh clock signal 144, 146, 148, 150.

To prevent the edges of the refresh clock signal 144, 146, 148, 150 from creating a conflict with any edges 154, 156 of the first glitch filter signal GF1_OUT, the refresh clock signal 144, 146, 148, 150 may be processed by the refresh edge generator 113 (FIG. 3) as follows: First, the refresh mask generator 112 generates a refresh mask signal which includes pulses 136, 138 (FIG. 4) that have timings based on the leading and falling edges 134, 158 of the digital data input signal DIN. Subsequently, the AND gate 116 generates a signal on line 142 that is high when the refresh clock signal on line 140 is high and the refresh mask signal (on line 126) is low, and that otherwise is low, to break up, into short pulses 160, 162, any portion of the refresh clock signal 144, 146, 148, 150 in the vicinity of an edge of the first glitch filter signal GF1_OUT. Subsequently, the second glitch filter 122 suppresses and does not reflect the short pulses 160, 162 in the second glitch filter signal GF2_OUT. The second glitch filter signal GF2_OUT is applied to the encoder 16 on line 36.

The refresh mask generator 112 receives the digital data output signal DIN on line 32. In the illustrated example, the refresh mask generator 112 issues a first pulse 136 when the digital data input signal DIN goes high, and a second pulse 138 when the digital data input signal DIN goes low. The amount of time from the leading edge of the first pulse 136 to the falling edge of the second pulse 138 is slightly greater than the amount of time from the leading edge 156 to the falling edge 154 of the first glitch filter signal GF1_OUT.

Therefore, the complement of the refresh mask signal can be applied to the AND gate 116 to cause the second glitch filter 122 to remove any refresh edges that are close to and prior to an edge of the first glitch filter signal GF1_OUT. If desired, the structure and operation of the second glitch filter 122 may be essentially the same as those of the first glitch filter 110. The processing performed by the refresh edge generator 113 ensures that the frequency of data going into the encoder 16 (on lines 34, 36) does not exceed the bandwidth of the receiver 22.

In the illustrated example, if the edges of the refresh clock signal 144, 146, 148, 150 do not conflict with any edges of the first glitch filter signal GF1_OUT, then the refresh edge generator 113 passes the complete refresh clock signal 144, 146, 148, 150, from line 140, into the encoder 16 for communication to the receiver 22. On the other hand, if an edge of the refresh clock signal 144, 146, 148, 150 would conflict with an edge of the first glitch filter signal GF1_OUT, then the refresh edge generator 113 suppresses what would be the conflicting portion of the refresh clock signal 144, 146, 148, 150 so that there is no conflict. As a result, the leading and falling edges 156, 154 of the first glitch filter signal GF1_OUT can be received and processed by the encoder 16 without any conflict that would otherwise be created by the refresh clock signal 144, 146, 148, 150.

If the refresh edge generator 113 were not employed in the system 10 illustrated in FIG. 1, a timing conflict could be generated between (A) an edge of one of the periodic pulses 144, 146, 148, 150 generated by the refresh clock generator 114 and (B) an edge 154, 156 of the first glitch filter signal GF1_OUT. For proper encoding of input edges, the encoder 16 should not receive, too close in time, (A) an edge from the first glitch filter 110 and (B) an edge from the refresh clock generator 114. The digital isolator system 10 of the present disclosure may be used to prevent such refresh path conflicts from occurring, and thereby achieves desirable resolution of data, and can do so without creating extra propagation delay or pulse skew.

In operation, the refresh clock signal is applied, on conductive line 140, to a first input 118 of the AND gate 116, and the inverse of the refresh mask signal is applied to a second input 120 of the AND gate 116. The output of the AND gate 116, on line 142, is applied to the second glitch filter 122. As a result, the digital isolator system 10 may suppress any refresh path edges close to any edge of the first glitch filter signal GF1_OUT, so that there is no conflict in the signals received by the encoder 16 on lines 34, 36.

Figure 5:
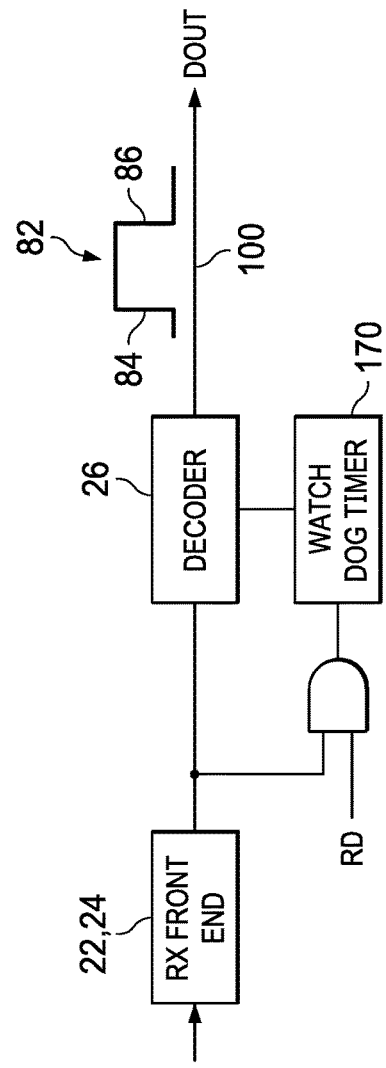
FIG. 5 is a block diagram of receiver-side architecture for the digital isolator system of FIG. 1.

Referring now to FIG. 5, the edge information transmitted through the isolation barrier 20 may be received by the receiver (RX) front end 22, 24 and decoded by the decoder 26 under the supervision of a watchdog timer 170. The decoder 26 converts carrier information to edge information, and constructs the digital data output signal DOUT based on edge information transmitted through the isolation barrier 20, as described above in connection with FIG. 2. If there is no activity on the receiver front end 22, 24 for a predetermined period of time, the watchdog timer 170 forces the digital data output signal DOUT to a defined state based on RD. The acronym RD stands for Refresh Disable. If RD=1, with a watch dog timer overflow on the receiver side, the digital data output signal DOUT goes to a fail-safe state. If RD=0, the receiver does not expect any refresh edges and stays in the same output until it receives edge information from the transmitter.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. An encoding and transmitting system for a digital isolator system, the encoding and transmitting system comprising:
    a transmitter for transmitting combined edge indicator signals through an isolation barrier;
    an encoder, coupled to the transmitter, for generating the combined edge indicator signals based on first and second signals;
    a refresh clock generator for generating a refresh clock signal based on the first signal; and
    a refresh edge generator, coupled to the refresh clock generator, for masking at least a portion of the refresh clock signal, such that the portion of the refresh clock signal is not reflected in the second signal.

2. The encoding and transmitting system of claim 1, wherein the refresh edge generator includes a refresh mask generator for generating a refresh mask signal based on a digital data input signal.

3. The encoding and transmitting system of claim 2, wherein the refresh edge generator includes at least one logic gate, coupled to the refresh clock generator and the refresh mask generator, for generating an output signal based on the refresh clock signal and the refresh mask signal.

4. The encoding and transmitting system of claim 3, wherein the logic gate includes an AND gate having first and second inputs, coupled to the refresh clock generator and the refresh mask generator, respectively, for receiving the refresh clock signal and a complement of the refresh mask signal, respectively, and an output for outputting the output signal.

5. The encoding and transmitting system of claim 3, wherein the refresh edge generator includes a glitch filter, coupled to the logic gate, for generating the second signal.

6. The encoding and transmitting system of claim 3, further comprising a glitch filter for generating the first signal.

7. The encoding and transmitting system of claim 6, further comprising a time-out circuit, coupled to the glitch filter, for operating the refresh clock generator based on the first signal.

8. A digital isolator system, comprising:
    a transmitter and a receiver;
    an isolation barrier for galvanically isolating the receiver from the transmitter;
    a first glitch filter for generating a first glitch filter signal based on a digital data input signal;
    an encoder, coupled to the first glitch filter, for generating combined edge indicator signals based on the first glitch filter signal and a second glitch filter signal;
    a refresh clock generator, coupled to the first glitch filter, for generating a refresh clock signal based on the first glitch filter signal; and
    a refresh edge generator, coupled to the refresh clock generator, and including a second glitch filter, for masking at least a portion of the refresh clock signal, based on the digital data input signal, such that the portion of the refresh clock signal is not reflected in the second glitch filter signal.

9. The digital isolator system of claim 8, wherein the refresh edge generator includes a refresh mask generator for generating a refresh mask signal based on the digital data input signal.

10. The digital isolator system of claim 9, wherein the refresh edge generator includes at least one logic gate, coupled to the refresh clock generator and the refresh mask generator, for generating an output signal based on the refresh clock signal and the refresh mask signal.

11. The digital isolator system of claim 10, wherein the logic gate includes an AND gate having first and second inputs, coupled to the refresh clock generator and the refresh mask generator, respectively, for receiving the refresh clock signal and a complement of the refresh mask signal, respectively, and an output for outputting the output signal.

12. The digital isolator system of claim 10, wherein the second glitch filter receives the output signal from the logic gate.

13. The digital isolator system of claim 8, wherein the isolation barrier includes a capacitive isolation barrier.

14. The digital isolator system of claim 8, wherein the isolation barrier includes a silicon dioxide-based capacitive isolation barrier.

15. The digital isolator system of claim 8, further comprising an integrated circuit chip, and wherein at least the transmitter, the isolation barrier, and the receiver are located on or within the integrated circuit chip.

16. The digital isolator system of claim 8, further comprising a time-out circuit, coupled to the first glitch filter, for operating the refresh clock generator based on the first glitch filter signal.

17. A method of operating a digital isolator system, comprising:
    transmitting combined edge indicator signals through an isolation barrier;
    generating the combined edge indicator signals based on first and second signals;
    generating a refresh clock signal based on the first signal; and masking at least a portion of the refresh clock signal such that the portion of the refresh clock signal is not reflected in the second signal.

18. The method of claim 17, wherein the masking of the portion of the refresh clock signal includes generating a refresh mask signal based on a digital data input signal.

19. The method of claim 18, wherein the masking of the portion of the refresh clock signal includes using at least one logic gate to generate an output signal based on the refresh clock signal and the refresh mask signal.

20. The method of claim 19, wherein the masking of the portion of the refresh clock signal includes using a glitch filter to generate the second signal based on the output signal.

\* \* \* \* \*